United States Patent [19]

Flannagan et al.

[11] Patent Number: 4,698,788
[45] Date of Patent: Oct. 6, 1987

[54] MEMORY ARCHITECTURE WITH SUB-ARRAYS

[75] Inventors: Stephen T. Flannagan; Paul A. Reed; John Barnes, all of Austin, Tex.

[73] Assignee: Motorola, Inc., Schaumburg, Ill.

[21] Appl. No.: 750,637

[22] Filed: Jul. 1, 1985

[51] Int. Cl.[4] .............................................. G11C 13/00
[52] U.S. Cl. ..................................... 365/205; 365/203
[58] Field of Search .................. 365/63, 72, 203, 205, 365/207, 208, 230, 189, 11

[56] References Cited

U.S. PATENT DOCUMENTS

| | | | |
|---|---|---|---|
| 4,239,993 | 12/1980 | McAlexander, III et al. | 365/205 |
| 4,366,559 | 12/1982 | Misaizu et al. | 365/208 |
| 4,528,646 | 7/1985 | Ochii et al. | 365/203 |

OTHER PUBLICATIONS

1982 IEEE ISCC Digest Technical Papers, Session XVIII: Static RAMS, A 64Kb CMOS RAM, Konishi et al., Feb. 12, 1982, pp. 258, 259 and 333.
1982 IEEE ISCC Digest Technical Papers, Session XVIII: Static RAMS, A 15nW Standby Power 64Kb CMOS RAM, Ochii et al., pp. 260, 261, 334.

Primary Examiner—Terrell W. Fears
Assistant Examiner—Melissa J. Koval
Attorney, Agent, or Firm—John A. Fisher; Jeffrey Van Myers; James L. Clingan, Jr.

[57] ABSTRACT

A static RAM has a plurality of sub-arrays arranged in rows and columns, each sub-array having word lines running the length of the sub-array in a top to bottom direction, and having bit lines running the width of the sub-array in a left to right direction, and having a word line driver for enabling a selected word line in response to receiving a row select signal corresponding to the selected word line; a global row decoder for providing the row select signals as determined by row address signals; a first plurality of column pre-decoders for performing a partial decode of data provided on the bit lines of a first of the rows of sub-arrays, each column pre-decoder corresponding to a particular sub-array; a second plurality of column pre-decoders for performing a partial decode of data provided on the bit lines of a second of the rows of sub-arrays, each column pre-decoder corresponding to a particular sub-array; and a plurality of sense amplifiers for sensing the output of the first and second column decoders. The static RAM has an architecture characterized by the memory having a top side, a bottom side, a left side, and a right side; the rows of sub-arrays running from left to right, and sequentially numbered from left to right with the first column of sub-arrays being nearest the top side; the columns of sub-arrays running from top to bottom, and sequentially numbered from top to bottom with the first row sub-arrays being nearest the left side; and the plurality of sense amplifiers being interposed in the rows of sub-arrays and located between the columns of sub-arrays.

5 Claims, 4 Drawing Figures

MEMORY ARCHITECTURE WITH SUB-ARRAYS

FIELD OF THE INVENTION

The present invention relates to a static random access memory (SRAM) architecture, and more particularly, to a SRAM architecture in which less than the whole memory is activated when a data location is accessed.

BACKGROUND OF THE INVENTION

In SRAMs there have developed various architectures which divide the memory array into sub-arrays in order to save power. In furtherance of this technique, a technique for dividing the memory into sub-arrays by dividing the word lines and bit lines with row and column decoders, respectively, was developed. Such a technique is described in U.S. Pat. No. 4,482,984, Oritani. This was useful for dividing into four sub-arrays. The power loss due to discharging the bit lines was reduced due to reducing the length and thus the capacitance of the bit lines. This had the advantage of saving power.

In advanced SRAMs, however, address transition detection is used to precharge various lines used for sensing data. By precharging less than all of the memory in response to an address transition, power is saved. As density increased, the need to divide the memory into even more sub-arrays resulted in another divided word line technique. In this technique, the memory is divided into sub-arrays in which only one sub-array has an activated word line. A further aspect of this approach is that there is a global row decoder which generates row select signals which traverse more than one sub-array. Each sub-array has its own word line drivers which are coupled to the row select signals. The word line drivers are enabled by a block select signal which is active when that sub-array (or block) with which the block select signal is associated is selected. This approach is described in an article entitled "A 64Kb Full CMOS RAM with Divided Word Line Structure", 1983 IEEE International Solid-State Circuits Conference, DIGEST OF TECHNICAL PAPERS, pgs. 58-59. This approach has the advantage of reducing the word line length, which reduces the delay as well as reducing the current required to charge the word line. The capacitance of the lines which carry the row select lines is less than word lines of comparable length because these row select lines are not connected to the inputs of the memory cells in the memory array. Consequently, the time required to activate a divided-word-line is reduced.

This does not, however, reduce the bit line capacitance because the bit lines are not reduced in length. Consequently, there is no reduction in the time for sensing the data on the bit lines once the word line has been activated.

SUMMARY OF THE INVENTION

An object of the present invention is to provide an improved memory architecture.

Another object of the invention is to provide a memory architecture with improved speed.

Yet another object of the invention is to provide a divided-word-line memory architecture with improved speed.

These and other objects are achieved in a static random access memory having blocks having a plurality of sub-arrays arranged in rows and columns, each sub-array having word lines running the length of the sub-array in a top to bottom direction, and having bit lines running the width of the sub-array in a left to right direction, and having a word line driver for enabling a selected word line in response to receiving a row select signal corresponding to the selected word line; a global row decoder for providing the row select signals as determined by row address signals; a first plurality of column pre-decoders for performing a partial decode of data provided on the bit lines of a first of the columns of sub-arrays, each column pre-decoder corresponding to a particular sub-array; a second plurality of column pre-decoders for performing a partial decode of data provided on the bit lines of a second of the columns of sub-arrays, each column pre-decoder corresponding to a particular sub-array; and a plurality of sense amplifiers for sensing the output of the first and second column decoders. The static RAM has an architecture characterized by the memory having a top side, a bottom side, a left side, and a right side; the rows of sub-arrays running from left to right, and sequentially numbered from left to right with the first column of sub-arrays being nearest the top side; the columns of sub-arrays running from top to bottom, and sequentially numbered from top to bottom with the first row sub-arrays being nearest the left side; and the plurality of sense amplifiers being located between the columns of sub-arrays.

DESCRIPTION OF THE INVENTION

Figure 1:
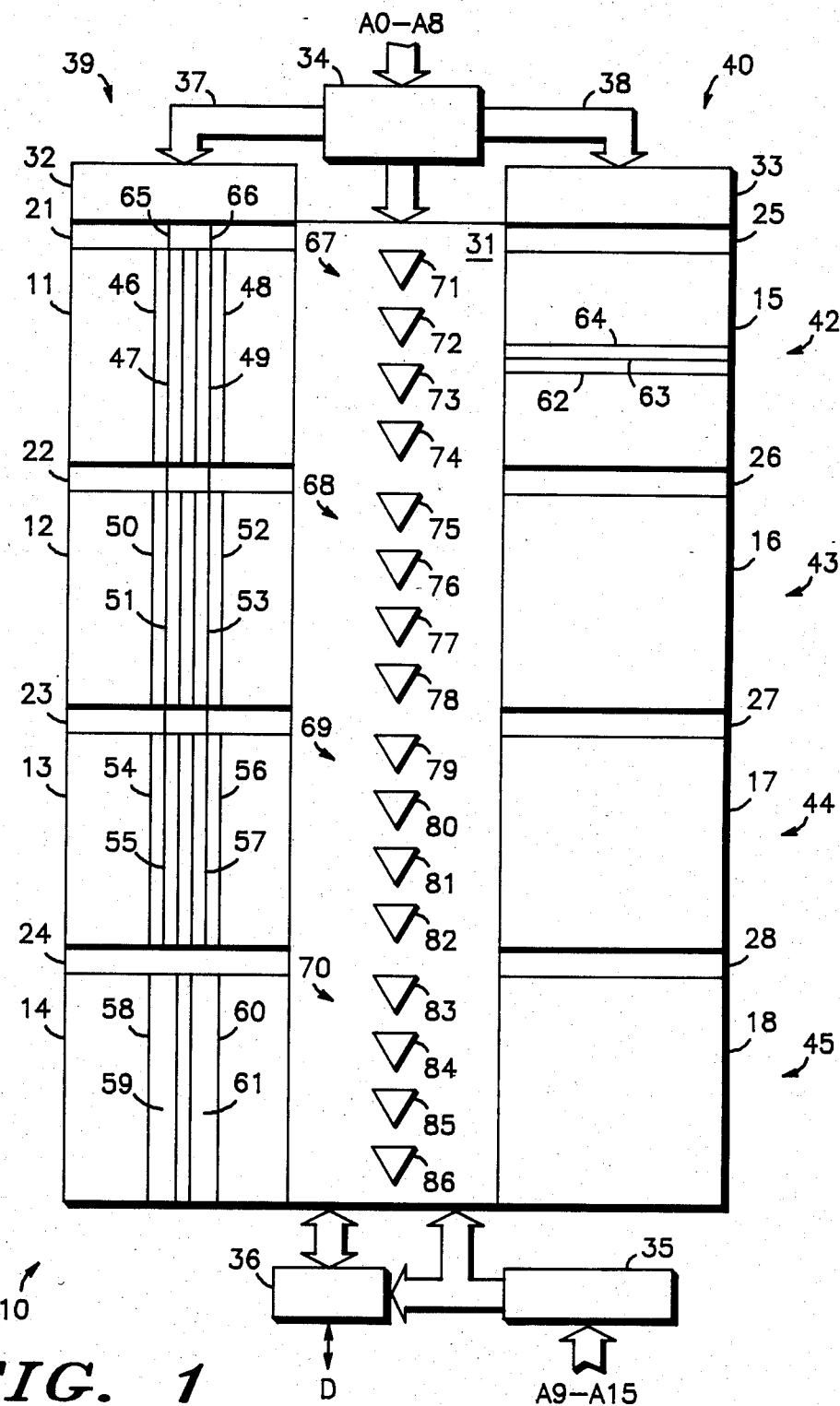
FIG. 1 is a layout of a memory circuit according to a preferred embodiment of the invention.

Shown in FIG. 1 is a memory 10 in layout form showing the physical relationship of the certain important functional blocks which comprise a memory architecture. Memory 10 comprises 8 sub-arrays 11, 12, 13, 14, 15, 16, 17, and 18; 8 word line driver blocks 21, 22, 23, 24, 25, 26, 27, and 28; a column block 31; a left global row decoder 32; a right global row decoder 33; a row address buffer/control block 34; a column address buffer/control block 35; and a control data I/O block 36. The various functional blocks are located primarily in relation to each other in layout form as is typical of architecture definition in a memory. FIG. 1 shows the architecture in two dimesional form with a top and a bottom, and a left and a right. The row address buffer/control block 34 is at the top with a bus 37 running down and to the left to the left global row decoder block, and with a bus 38 running down and to the right to the right global row decoder 32. Word line driver block 21 is immediately below row decoder 32. Sub-array 11 is immediately below word line driver 21. Word line driver 22 is immediately below sub-array 11. Sub-array 12 is immediately below driver 22. Word line driver 23 is immediately below sub-array 12. Sub-array 13 is immediately below driver 23. Word line driver 24 is immediately below sub-array 13. Sub-array 14 is immediately below driver 24. Word line driver block 25 is immediately below row decoder 33. Sub-array 15 is immediately below word line driver 25. Word line driver 26 is immediately below sub-array 15. Sub-array 16 is immediately below driver 26. Word line driver 27 is immediately below sub-array 16. Sub-array 17 is immediately below driver 27. Word line driver 28 is immediately below sub-array 17. Sub-array 18 is immediately below driver 28. Sub-arrays 11-14, which run in a top to bottom direction, form a column 39 of sub-arrays. Sub-arrays 15-18, which run in a top to bottom direction, form a column 40 of sub-arrays. Sub-arrays 11 and 15, which run in a left to right direction, form a row 42 of sub-arrays. Sub-arrays 12 and 16, which run in a left to right direction, form a row 43 of sub-arrays. Sub-arrays 13 and 17, which run in a left to right direction, form a row 44 of sub-arrays. Sub-arrays 14 and 18, which run in a left to right direction, form a row 45 of sub-arrays. Column block 31 runs between, and in parallel with, columns 39 and 40. Column block 31 is thus interposed and breaks into each of rows 42-45. Word line drivers 21-24 are on top of sub-arrays 11-14, respectively, of column 39. Word line drivers 25-28 are on top of sub-arrays 15-18, respectively. As used herein, "on top of" is used in the two dimensional planar sense as is appropriate for describing an architecture.

Sub-arrays 11-18 each have 128 overlying bit line pairs and 64 overlying word lines. As used herein, "overlying" is used in the three dimesional sense. The use of word lines and bit lines is well known in the art. By way of example, 4 word lines are shown for each of sub-arrays 11-14, and 3 bit lines are shown for sub-array 15. The word lines run in a top to bottom direction, and the bit lines run in a left to right direction. For sub-array 11, word lines 46-49 are shown. For sub-array 12, word lines 50-53 are shown. For sub-array 13, word lines 54-57 are shown. For sub-array 14, word lines 58-61 are shown. For sub-array 15, bit line pairs 62-64 are shown. Columns 39 and 40 each have 32 row select lines which run in the top to bottom direction. By way of example, row select lines 65 and 66 are shown for column 39. For each row select line there are two corresponding word lines adjacent to that row select line for each sub-array in the particular column. Each word line is adjacent to only one row select line, that being the corresponding row select line. Row select line 65 has corresponding word lines 46-47, 50-51, 54-55, and 58-59. Row select line 66 has corresponding word lines 48-49, 52-53, 56-57, and 60-61. Row select lines 65 and 66 extend from row decoder 32 to word line driver 24, overlying sub-arrays 11-13 therebetween.

The word lines are formed in two layers. One layer is polysilicon which forms the gates of transfer transistors which enable individual memory cells. The other layer is metal which overlies the polysilicon word lines. Each overlying metal word line is strapped to a corresponding polysilicon word line to increase the speed with which the memory cells are accessed. This strapping of overlying metal to polysilicon for high speed word lines is known in the art. The row select lines are metal lines formed in the same layer as the metal word lines. The row select lines carry information used by the word line drivers so terminate with the last word line driver. The row select lines, thus need not extend to overlie the last sub-array in the column of sub-arrays. As shown, row select lines 65 and 66 do not extend to overlie sub-array 14, the last sub-array in column 37. Each row select line runs between the word lines which correspond to that row select line over all but the last sub-array. As shown in FIG. 1, row select line 65 runs between word lines 46 and 47 over sub-array 11, and between word lines 50 and 51 over sub-array 12, and between word lines 54 and 55 over sub-array 13.

Column block 31 is coupled to sub-arrays 11-18, word line drivers 21-28, block 34, block 35, and block 36. Column block 31 provides column decoding, local sensing of data, routing of sub-array selection signals, and data routing. There are 65,536 memory locations defined by the 16 address signals A0-A15. Address signals A0-A8 define which word line is activated (or enabled). With 64 word lines and 8 sub-arrays this is a one of 512 selection. Column block 31 routes the sub-array seclection signals to the word line drivers to aid in the word line enabling process. Each column 39, 40 has 32 row select lines so there are a total of 64 row select lines. Address signals A0-A5 provide a one of 64 selection to define which of the row select lines is activated. One of the two word lines which correspond to the activated row select line will be activated. This one of two selection is determined by address A6. Address A5 defines between left and right, i.e., between column 39 and 40. Block 34 provides 16 sub-array selection signals to column block 31. Each word line driver block receives two of these sub-array selection signals. For a given word line selection, only one of the 16 sub-array selection signals is activated. The reason each word line driver block receives two sub-array selection signals is to select between the two word lines which correspond to and are adjacent to the activated row select line. Address signals A7 and A8 which sub-array within a column of sub-arrays is selected. Address signals A5, A7, and A8 define which sub-array is activated for purposes of precharging as well as word line selection.

In a read mode, when one of signals A0-A8 switches state, a row address transition signal is activated which causes the selected sub-array to be precharged. This has become a typical technique in high speed SRAMS. The precharging of a sub-array is to precharge and equalize the bit lines thereof. This precharging is a significant portion of the power consumed by the memory. As such a significant power saving is achieved by precharging only the sub-array which is to provide data. Address signals A5, A7, and A8 determine which single sub-array is precharged in response to an address transition of one or more of address signals A0-A8. All other sub-arrays remain precharged and deselected.

In conjunction with a word line being activated, column block 31 provides decoding and sensing in order to obtain the selected data from the activated sub-array in the read mode. Address signals A9-A15 provide a one of 128 selection to define which bit line within the sub-array will provide the data. In the sensing procedure as well as the word line selection procedure, the activated sub-array must be determined. The sub-array selection signals are also useful for this purpose because they define which sub-array is selected. There are four sets of sense amplifiers 67, 68, 69, and 70 present in column block 31, corresponding to rows 42, 43, 44, and 45, respectively. Each set of sense amplifiers is comprised of four sense amplifiers. Set 67 is comprised of sense amplifiers 71-74 in close proximity to corresponding sub-arrays 11 and 15. Set 68 is comprised of sense amplifiers 75-78 in close proximity to corresponding sub-arrays 12 and 16. Set 69 is comprised of sense amplifiers 79-82 in close proximity to corresponding sub-arrays 13 and 17. Set 70 is comprised of sense amplifiers 83-86 in close proximity to corresponding sub-arrays 14 and 18. Predecoding defined by address signals A9–A13 couples 4 bit line pairs from an activated sub-array to respective sense amplifiers which correspond to the activated sub-array.

Figure 2:
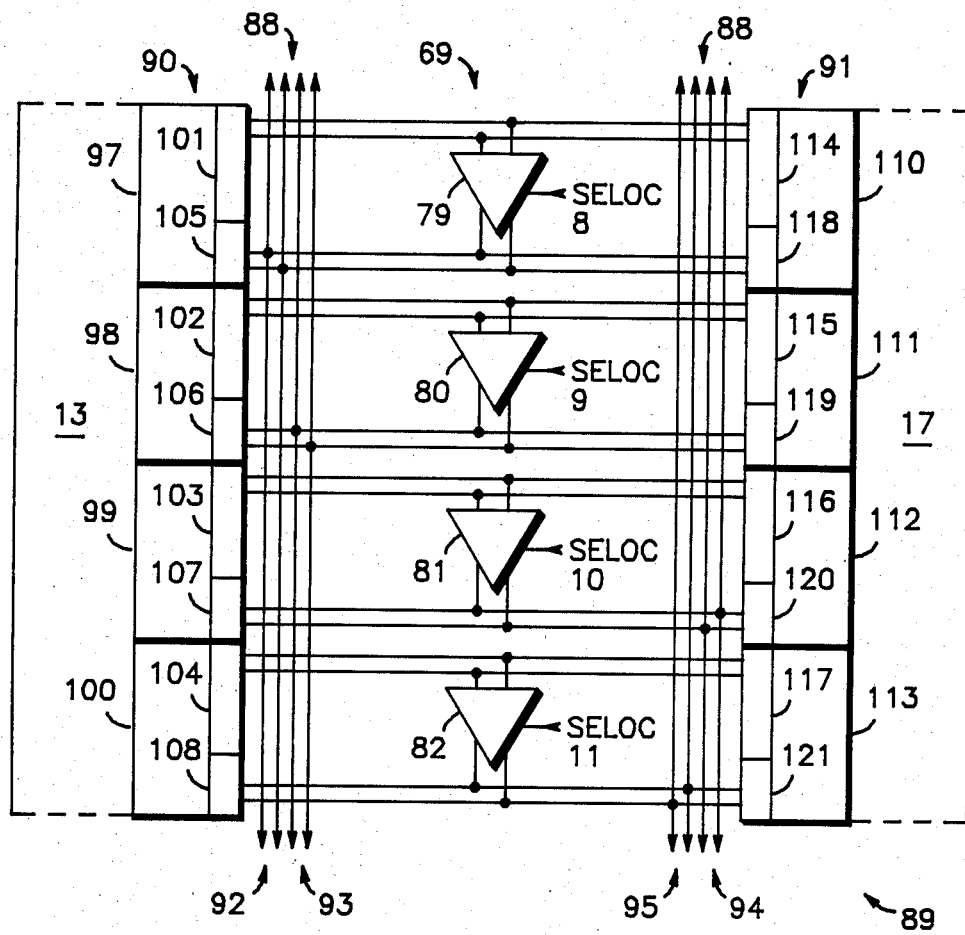
FIG. 2 is a block diagram of a portion of the memory circuit of FIG. 1 according to the preferred embodiment of the invention.

Global data lines 88 not shown in FIG. 1 but shown in FIG. 2 are routed from sense amplifiers 71–86 through column block 31 to block 36. Shown in FIG. 2 is a portion 89 of column block 31 and sub-arrays 13 and 17. Portion 89 comprises a column decoder portion 90 coupled to sub-array 13, a column decoder portion 91 coupled to sub-array, set of sense amplifiers 69, as well as global data lines 88. Four pairs of data lines 92, 93, 94, and 95 comprise global data lines 88. Each of the sets of sense amplifiers 67–70 has outputs controllably coupled to these four data line pairs 92–95. Which set of amplifiers that is coupled to the data line pairs is defined by address signals A7 and A8. Each set of amplifiers 67–70 has inputs which are controllably coupled to one of the two sub-arrays that are in the same row. Which one of the four pairs of data lines 92–95 is selected for data is determined by address signals A14 and A15. Signals A14 and A15 also define which of the four sense amplifiers within the set of amplifiers is not disabled. The control signals necessary to provide the one of four data pair selection are coupled from block 35 to block 36.

In a write mode the word line selection is the same as for the read mode. In the write mode the bit line pairs need not be precharged. The column decoding is also very similar. A write driver is employed instead of sense amplifiers. The write driver is located in block 36. Address signals A14 and A15 determine which pair of global data lines 88 carry the data to be written. The sense amplifiers are all made to be high impedance, commonly known as tri-stated. The sense amplifiers are bypassed in the write mode so that the selected data line pair is coupled to the column decoder. For a given address, there are 4 data paths made available between the selected sub-array and the set of sense amplifiers for that sub-array. A bypass for each between the global data lines and the decoders establishes 4 paths to the sub-array when only one is desired. Three of these potential data paths are blocked as determined by address signals A14 and A15.

Shown in FIG. 2 are more details helpful in describing the data selection and sensing process provided by column block 31. Column decoder 90 is comprised of four column pre-decoders 97, 98, 99, and 100; four secondary column decoders 101, 102, 103, and 104; and four write coupling circuits; 105, 106, 107, and 108. Similarly, column decoder 91 is comprised of four column pre-decoders 110, 111, 112, and 113; four secondary column decoders 114, 115, 116, and 117; and four write coupling circuits; 118, 119, 120, and 121. Each of the other sub-array pairs 11–15, 12–16, and 14–18 also have an associated four column pre-decoders, four secondary column decoders, and four write coupling circuits. Sense amplifiers 71–86 each receive a select operating clock unique to that amplifier designated SELOC 0–15. As shown in FIG. 2, amplifiers 79, 80, 81, and 82 receive clocks SELOC 8, SELOC 9, SELOC 10, and SELOC 11. Only one of the SELOC clocks is active for a given data access in the read mode. In the write mode, all of the SELOC clocks are inactive.

Assume for as an example that data from sub-array 13 is to be output on data line pair 92. A word line in sub-array 13 is activated as determined by address signals A0–A8. Decoders 97–100 all respond to the address by providing an output to secondary decoders 101–104, respectively. Decoders 97–100 are each coupled to one fourth of the 128 bit line pairs of sub-array 13 which is 32 bit line pairs. Decoders 97–100 provide a 2 of 32 selection so that two bit line pairs are coupled to each of secondary decoders 101–104 via decoders 97–100. Secondary decoders 101–104 each have a pair of outputs coupled to inputs of amplifiers 79–82, respectively. Secondary decoders 101–104 perform a one of two selection to couple a bit line pair to each of amplifiers 79–82. The one of two selection is determined by the state of address signal A9. Secondary decoders 114–117 all are tri-stated to provide a high impedance output. Amplifiers 79–82 each have a pair of outputs coupled to data line pairs 92–95, respectively. In the present example, SELOC 8 is activated while clocks SELOC 9–11 remain inactive so that only amplifier 79 is activated. Conseqently, the data carried by the pair of bit lines coupled to amplifier 79 is provided onto data line pair 92 where it is received by block 36. In the inactive state, amplifiers 80–82 are tri-stated.

If a write is to occur into sub-array 13 via data line pair 92, a word line in sub-array 13 is activated as determined by address signals A0–A8. All of clocks SELOC 8–11 will be inactive so that amplifiers 79–83 will be tri-stated. Block 36 provides the data onto data line 92 as determined by address signals A14 and A15. In response to the address, decoder 97 has two bit line pairs coupled to write coupling circuit 105. Write coupling circuit 105 couples data line 92 to one of these pairs as determined by address signal A9. Thus the data is coupled to the selected memory cell at the intersection of the activated word line and the selected bit line pair.

Figure 3:
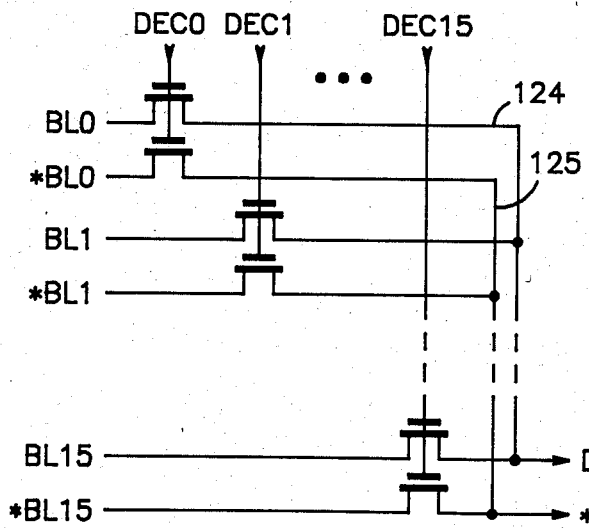
FIG. 3 is circuit diagram of a first portion of the block diagram of FIG. 2.

Decoders 97–100 and 110–113 each have two pass gate portions like pass gate circuit 123 shown in FIG. 3 for coupling bit lines to secondary decoders 101–104 and 114–117. There are 16 decoded address signals DECO–DEC15 which are generated in response to address signals A10–A13 for coupling one of 16 bit lines to a local data line. In a selected sub-array as determined by address signals A5, A7, and A8, one of signals DEC-0–EC15 is activated for each pass gate circuit. There are 8 pass gate circuits for each sub-array. In the deselected sub-arrays, all signals DEC0–DEC15 are held inactive. As shown in FIG. 3, bit lines BL0–BL15 are selectively coupled to a local data line 124 and the complemetary bit lines *BL0–*BL15 are selectively coupled to local data line 125. The coupling from bit line to local data line is achieved with a single pass gate for each bit line so that there are 16 pass gates per local data line. Each secondary decoder 101–104 and 114–117 is coupled to 2 corresponding data line pairs. The single pass gate is shown to be an N channel transistor. It is preferred, however, to have an additional P channel in parallel with the N channel trnasistors which are enabled by signals complementary to the DEC0–DEC15 signals. This can be viewed as using conventional transmission gates for the pass gates. Each secondary decoder is coupled to 2 local data line pairs. Each corresponding write coupling circuit is also coupled to the same pair of local data lines.

Figure 4:
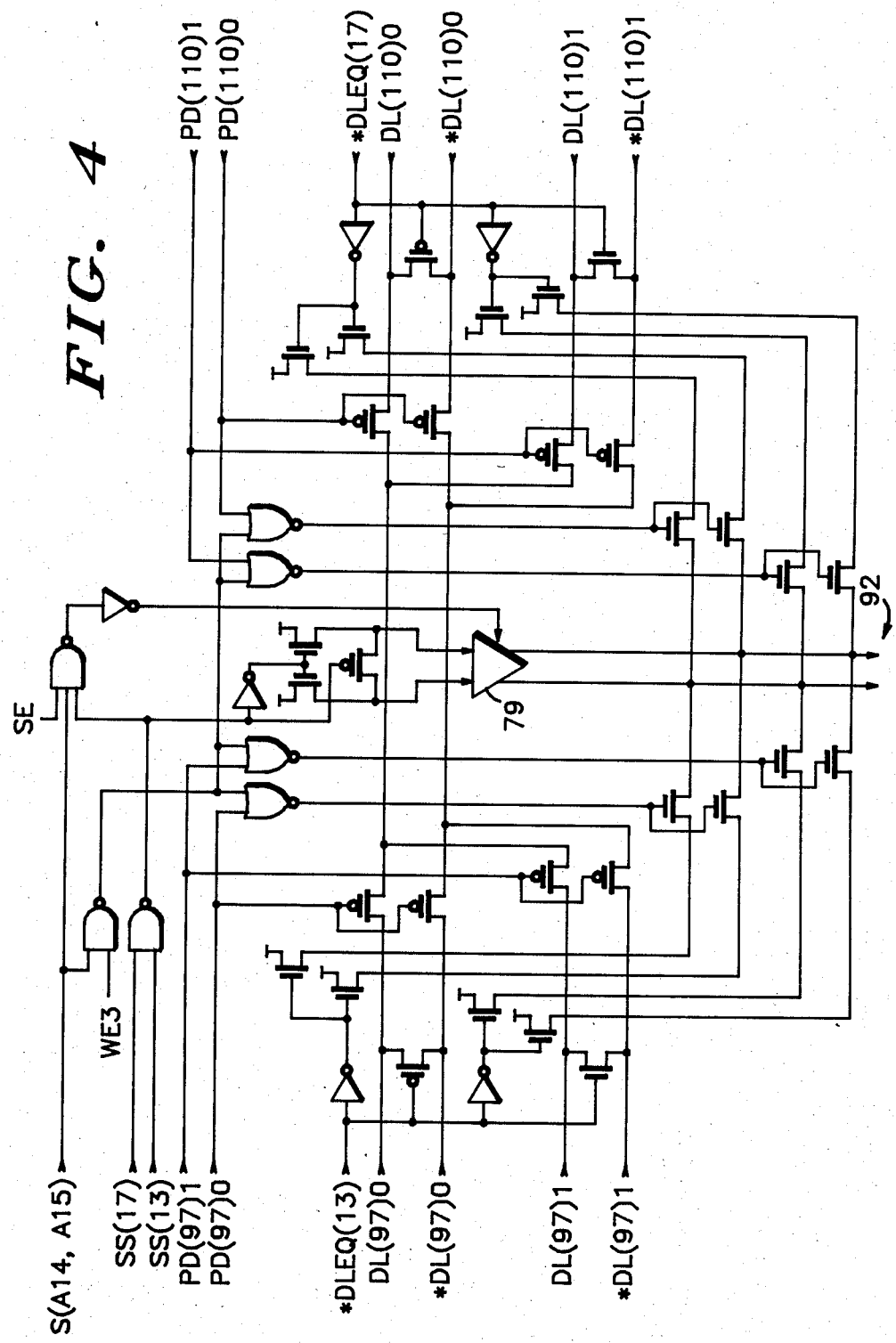
FIG. 4 is a combination block and circuit diagram of a second portion of the block diagram of FIG. 2

Shown in FIG. 4 is a circuit/logic diagram of secondary decoders 101 and 114, and write coupling circuits 105 and 118. Sense amplifier 79 is also shown in FIG. 4. Signals DL(97)0, *DL(97)0, DL(97)1, and *DL(97)1 are the decoded outputs of decoder 97 present on the local data lines thereof. Similarly, signals DL(110)0, *DL(110)0, DL(110)1, and *DL(110)1 are the decoded outputs of decoder 110 present on the local data lines thereof. Signals *DLEQ(13) and *DLEQ(17) are equalization pulses generated in response to a row or column address transition and controlled by address signals A5, A7, and A8 to activate only the equalization pulse corresponding to the selected sub-array. Signals PD(97)1, PD(97)0, PD(110)1, and PD(110)0 are selected to be active by address signals A5, A7, A8, and A9 to enable a selected pass device. Signals SS(13) and SS(17) are defined by address signals A5, A7, A8 as sub-array select signals. Signal WE3 is a write enable signal which is active as a logic high during a write. Signal S(A14, A15) is a sense amplifier selection signal defined by address signals A14 and A15. Signal SE is a sense amplifier enable signal which will disable all of the sense amplifiers when it is a logic low. The transistors which have a circle on the gate are P channel transistors and the others are N channel.

An architecture is thus shown which provides the advantages of precharging only one sub-array in 8, a divided word line so that the only word line which is activated is one present in the selected sub-array, and a shortened bit line with local sensing to improve speed. With a shortened bit line there is less capacitance on the bit line. For a given cell size, the cell will be able to change the voltage present on the bit line more rapidly on a shorter bit line. With local sensing a selected bit line incurs very little additional capacitance due to the column decoder coupling. If sensing were to occur at the bottom of the chip, a data line would be required to run from the sub-array to the bottom of the chip. Such a data line would have at least as much capacitance as a bit line. Conseqently, a memory cell coupled to selected bit line would also be coupled to the capacitive data line with the consequent result of no improvement in speed even with a shortened bit line.

We claim:

1. A static random access memory responsive to column and row address signals, comprising:
   a plurality of sub-arrays arranged in a plurality of rows and at least first and second columns, each sub-array having word lines running the length of the sub-array in a top to bottom direction, having bit line pairs running the width of the sub-array in a left to right direction, and having a word line driver for enabling a selected word line in response to receiving a row select signal corresponding to the selected word line;
   a global row decoder for providing the row select signals as determined bh row address signals;
   a plurality of column decoders for performing a decode of data provided on the bit lines of the first and second columns of sub-arrays, each column decoder corresponding to a particular sub-array; and
   a plurlaity of sense amplifiers for sensing the output of the column decoders;
   characterized in that:
   the memory has a top side, bottom side, a left side, and a right side;
   the rows of sub-arrays run from left to right, and are sequentially arranged from top to bottom, with a first row of sub-arrays being nearest the top side;
   the columns of sub-arrays running from top to bottom, and sequentially arranged from left to right, with the first column of sub-arrays being nearest the left side; and
   the plurality of sense amplifiers comprises sets of amplifiers, wherein one set of amplifiers is located in each row between said first and second columns.

2. The static random access memory of claim 1, further chracterized in that:
   each amplifier in a set of amplifiers is shared by the sub-arrays which are located in the row of sub-arrays in which the set of amplifiers is located.

3. The static random access memory of claim 2, further characterized in that:
   two word lines correspond to each row select line; and the word line drivers provide a one of two selection between the two corresponding word lines.

4. A static random access memory, comprising:
   eight sub-arrays arranged in first and second columns and first, second, third, and fourth rows, each sub-array having word lines running the length of the sub-array in a top to bottom direction, having bit line pairs running the width of the sub-array in left to right direction, and having a word line driver for enabling a selected word line in response to receiving a row select signal corresponding to the selected word line;
   a first global row decoder adjacent to the first column for providing the row select signal to the sub-arrays in the first column as determined by row address signals;
   a second global row decoder adjacent to the second column for providing the row select signals to the sub-arrays in the second column as determiend by row address signals;
   four sets of four sense amplifier, seach set located in a particulat row and between the first and second columns; and
   eight column decoders, each column decoder corresponding to a particular sub-array, and adjacent thereto and for copupling four selected bit line pairs from its corresponding sub-array to the set of sense amplifiers which is located int he same row as the corresponding sub-array.

5. The static random access memory of claim 4, wherein:
   the memory has a top side, a bottom side, a left side, and a right side;
   the rows run from left to right, and are sequentially arranged from top to bottom, with the first row being nearest the top side; and
   the columns running from top to bottom, and sequentially arranged from left to right, with the first column being nearest the left side.

* * * * *

UNITED STATES PATENT AND TRADEMARK OFFICE
CERTIFICATE OF CORRECTION

PATENT NO.   :   4,698,788
DATED        :   10/06/87
INVENTOR(S)  :   Stephen T. Flannagan et al It is certified that error appears in the above-identified patent and that said Letters Patent is hereby corrected as shown below:

column 7, line 49, change "bh" to --by--.

column 8, line 40, change "amplifier, seach" to --amplifiers, each--.

column 8, line 41, change "particulat" to --particular--.

column 8, line 45, change "copupling" to --coupling--.

column 8, line 47, change "int he" to --in the--.

Signed and Sealed this

Twenty-second Day of March, 1988

Attest:

DONALD J. QUIGG

Attesting Officer

Commissioner of Patents and Trademarks